(12) United States Patent
Kimura

(10) Patent No.: US 6,401,353 B2
(45) Date of Patent: Jun. 11, 2002

(54) SUBSTRATE DRYER

(75) Inventor: Masahiro Kimura, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/800,537

(22) Filed: Mar. 7, 2001

(30) Foreign Application Priority Data

| Mar. 8, 2000 | (JP) | 2000-063678 |
| Apr. 26, 2000 | (JP) | 2000-125805 |
| Apr. 26, 2000 | (JP) | 2000-125806 |

(51) Int. Cl.[7] .............................................. F26B 21/14
(52) U.S. Cl. .................. 34/72; 34/330; 34/343; 34/350; 34/351
(58) Field of Search .................. 34/329, 330, 343, 34/348, 349, 350, 351, 381, 72, 83, 84

(56) References Cited

U.S. PATENT DOCUMENTS

| 3,903,012 A | * | 9/1975 | Brandreth | 252/194 |
| 5,714,203 A | * | 2/1998 | Schellenberger et al. | 427/378 |
| 5,882,425 A | * | 3/1999 | Graham | 134/1.3 |
| 5,972,724 A | * | 10/1999 | Arndt et al. | 438/14 |
| 5,976,900 A | * | 11/1999 | Qiao et al. | 438/14 |
| 6,092,298 A | * | 7/2000 | Salminen et al. | 34/71 |
| 6,132,811 A | * | 10/2000 | Schellenberger et al. | 427/443.2 |
| 6,134,807 A | * | 10/2000 | Komino et al. | 34/418 |
| 6,185,839 B1 | * | 2/2001 | Kholodenko et al. | 34/255 |
| 2001/0029683 A1 | * | 10/2001 | Murphy et al. | 34/471 |

* cited by examiner

*Primary Examiner*—Ira S. Lazarus
*Assistant Examiner*—K. B. Rinehart
(74) *Attorney, Agent, or Firm*—Ostrolenk, Faber, Gerb & Soffen, LLP

(57) ABSTRACT

A substrate dryer causing no water mark on a substrate having a refined·complicated structure and capable of suppressing increase of a cost required for a drying treatment is provided. Drying gas of low-molecular silicone generated in a drying gas generation part is heated by a heater and thereafter supplied from a drying gas supply nozzle. The drying gas is supplied to the main surface of a substrate being pulled up from de-ionized water stored in a cleaning bath as a stream. Silicone contained in the drying gas is condensed on the surface of the substrate, substitutes for moisture, and thereafter vaporizes. Silicone is excellent in permeability·dryability, and hence can suppress formation of a water mark also on a substrate having a refined·complicated structure. Further, silicone applies no load to the environment, and hence increase of a cost required for the drying treatment can be suppressed without requiring specific treatment for disposal.

23 Claims, 12 Drawing Sheets

SUBSTRATE DRYER

BACKGROUND OF THE INVENTION

1. Field of the Invention

The present invention relates to a substrate dryer for drying a semiconductor substrate, a glass substrate for a liquid crystal display unit, a glass substrate for a photomask, a substrate for an optical disk or the like (hereinafter simply referred to as "substrate") cleaned with de-ionized water (pure water).

2. Description of the Background Art

In general, a surface treatment such as etching with a chemical solution or cleaning with de-ionized water and a drying treatment are successively performed on the aforementioned substrate, to achieve a series of substrate treatments. In such series of treatments, the drying treatment is generally executed as the final treatment following finishing cleaning with de-ionized water.

In general, the substrate is dried by a method (the so-called spin drying) of rotating the substrate at a high speed and draining water by centrifugal force or a method employing IPA (isopropyl alcohol). Following recent complication of the semiconductor device structure, however, a drying failure called as a water mark is noted, and the drying method employing IPA hardly causing this problem is now forming the mainstream. The water mark, which is a drying spot caused by moisture adhering to the surface of the substrate and reacting with silicon forming the substrate and oxygen contained in the air to form particles, is readily caused as the time when the moisture adheres to the surface of the substrate increases.

The drying method employing IPA includes a method (IPA vapor drying) of spraying vapor of IPA onto the surface of the substrate to which moisture adheres or a method (Marangoni drying) of pulling up and passing the substrate through a thin liquid layer of IPA formed on the surface of de-ionized water. IPA substitutes for the moisture adhering to the surface of the substrate and vaporizes in a short time, to relatively hardly cause a water mark in the drying method employing IPA.

As generally known, however, importance is recently attached to environmental problems, while IPA applies load on the environment if discharged as such. In any of the aforementioned methods, therefore, a prescribed disposal treatment must be performed for making IPA harmless to the environment. However, such a disposal treatment requires a considerably high cost as a matter of course, to disadvantageously increase the cost for the substrate treatment.

Further, the structure of a device formed on the surface of the substrate is recently so refined·complicated that the problem of a water mark may arise also in the drying method employing IPA. In Marangoni drying, further, a Marangoni convection formed on the interface between the liquid layer of IPA and the de-ionized water may disadvantageously result in transfer of particles adhering to the surface of the substrate.

SUMMARY OF THE INVENTION

The present invention is directed to a substrate dryer for drying a substrate cleaned with de-ionized water.

According to a first aspect of the present invention, a substrate dryer for drying a substrate cleaned with de-ionized water comprises a cleaning bath storing de-ionized water for dipping a substrate in the de-ionized water thereby cleaning the substrate, a pull-up robot pulling up the cleaned substrate from the cleaning bath, and a drying gas supply part supplying drying gas containing silicone gas to the main surface of the substrate being pulled up by the pull-up robot.

Silicone can suppress formation of a water mark also on a substrate having a refined·complicated structure due to its excellent permeability·dryability while applying no load to the environment. Therefore, no specific treatment is required for disposing silicone but increase of the cost required for the drying treatment can be suppressed.

According to another aspect of the present invention, a substrate dryer for drying a substrate cleaned with de-ionized water comprises a cleaning bath storing de-ionized water for dipping a substrate in the de-ionized water thereby cleaning the substrate, a pull-up robot pulling up the cleaned substrate from the cleaning bath, and a drying gas supply part supplying drying gas containing gas of a fluorine-based inactive liquid to the main surface of the substrate being pulled up by the pull-up robot.

The fluorine-based inactive liquid can suppress formation of a water mark also on a substrate having a refined·complicated structure due to its excellent permeability·dryability while applying no load to the environment. Therefore, no specific treatment is required for disposing the fluorine-based inactive liquid but increase of the cost required for the drying treatment can be suppressed.

According to still another aspect of the present invention, a substrate dryer for drying a substrate cleaned with de-ionized water comprises a cleaning bath storing de-ionized water for dipping a substrate in the de-ionized water thereby cleaning the substrate, a pull-up robot pulling up the cleaned substrate from the cleaning bath, and a silicone layer forming part supplying a drying liquid containing silicone to the surface of the de-ionized water stored in the cleaning bath for forming a silicone layer, while the pull-up robot pulls up the cleaned substrate from the cleaning bath thereby passing the substrate through the silicone layer formed on the surface of the de-ionized water stored in the cleaning bath.

Silicone allows no adhesion of particles onto a substrate having a refined·complicated structure due to its excellent permeability·dryability while applying no load to the environment. Therefore, no specific treatment is required for disposing silicone but increase of the cost required for the drying treatment can be suppressed.

Accordingly, an object of the present invention is to provide a substrate dryer causing no water mark also on a substrate having a refined·complicated structure and capable of suppressing increase of a cost required for a drying treatment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

Figure 1:
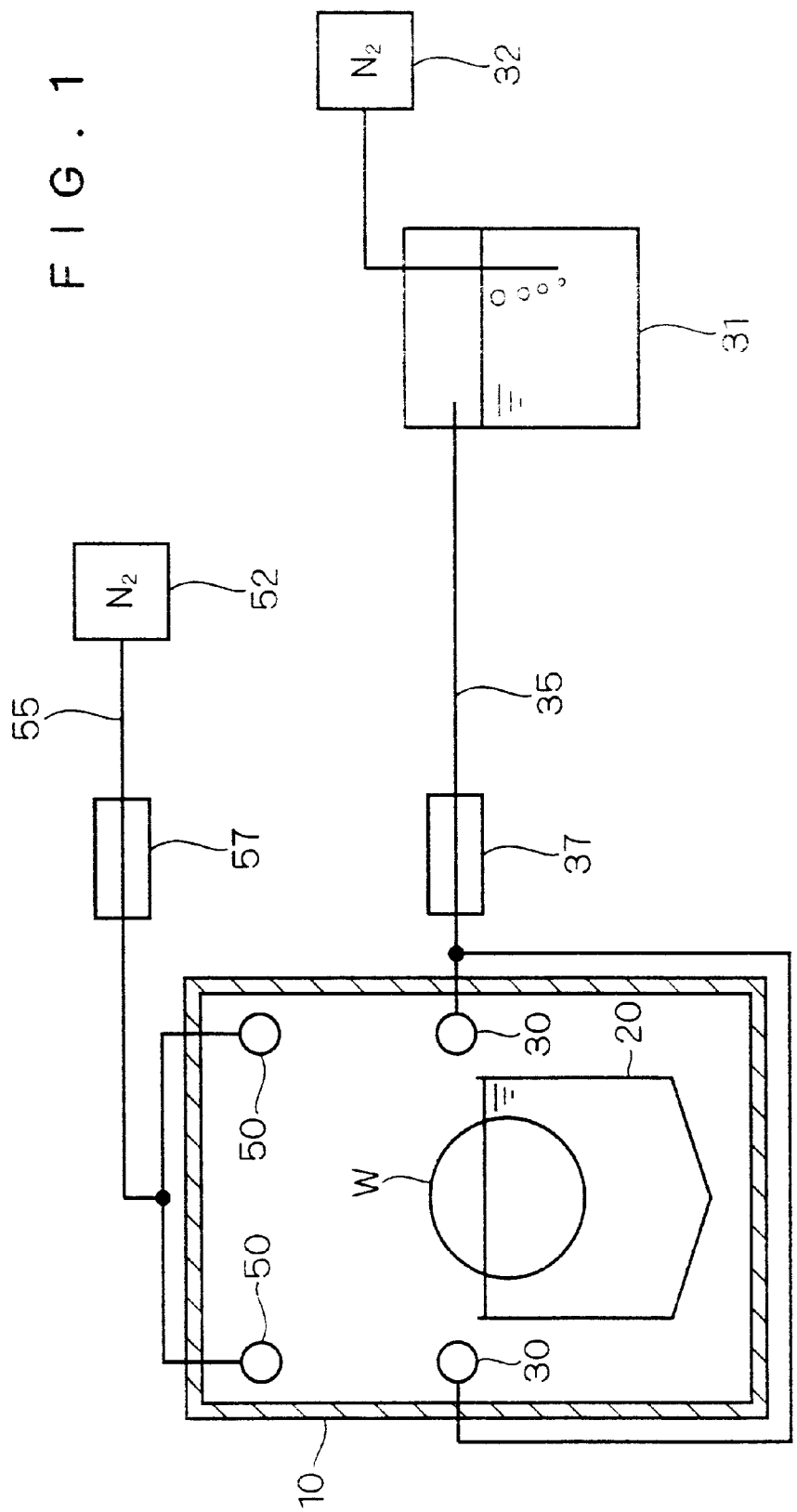
FIG. 1 illustrates the overall structure of a substrate dryer according to a first embodiment of the present invention.
Figure 2:
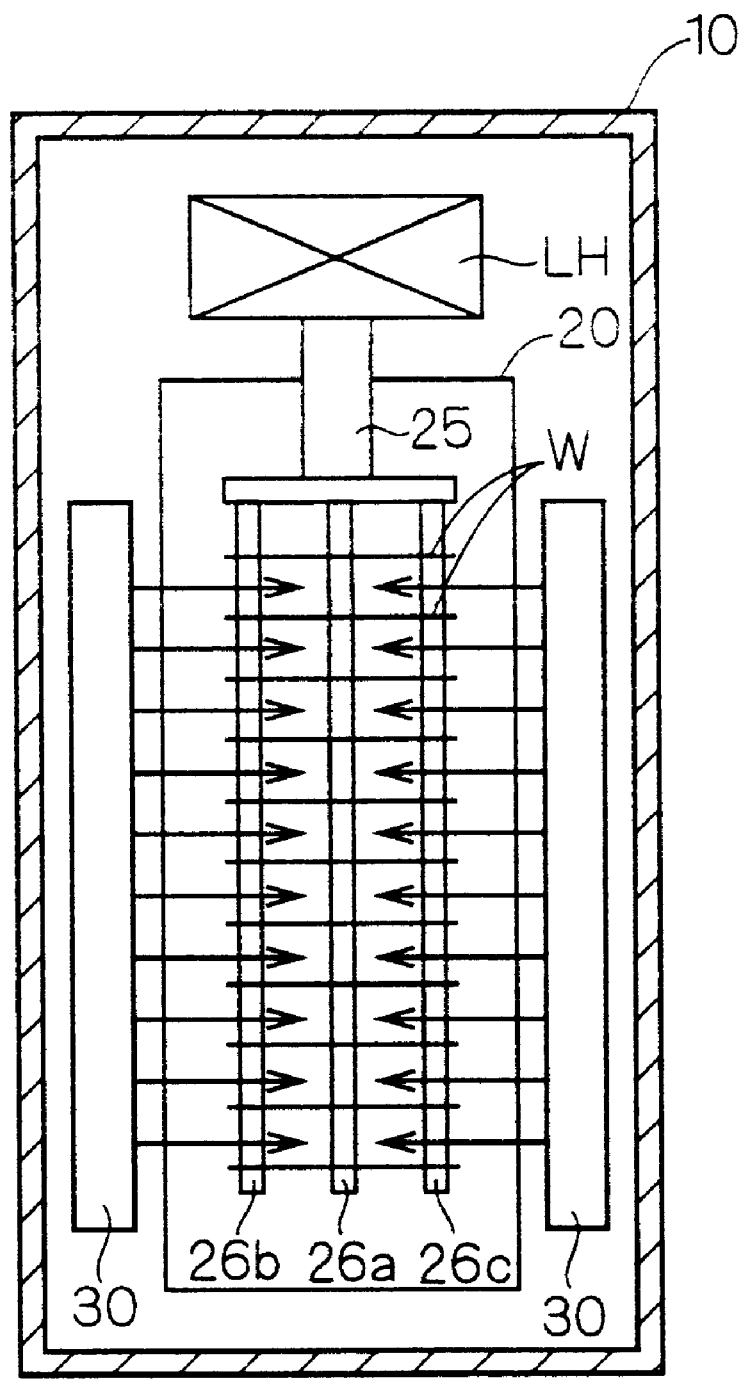
FIG. 2 is a plan view of a drying vessel in the substrate dryer shown in FIG. 1.
Figure 3:
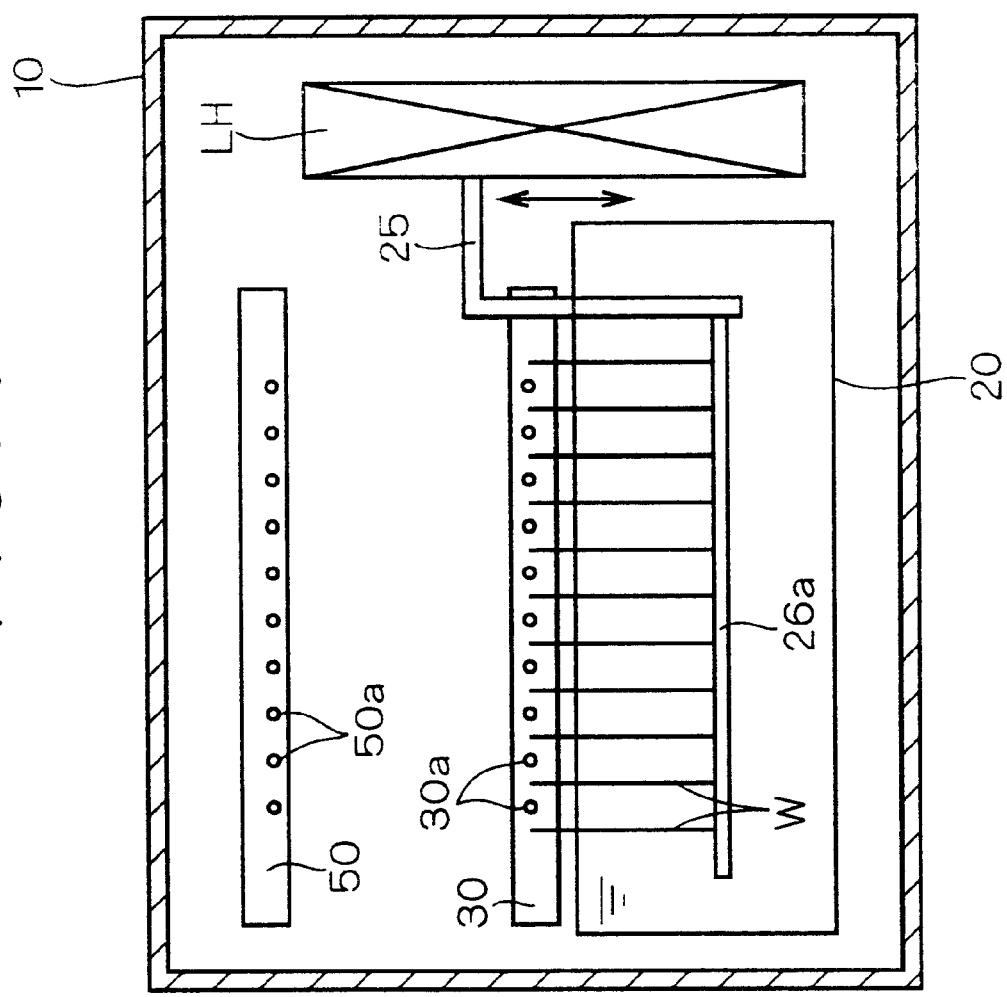
FIG. 3 is a side elevational view of the drying vessel of the substrate dryer shown in FIG. 1.

FIG. 1 illustrates the overall structure of a substrate dryer according to a first embodiment of the present invention. This substrate dryer is generally formed by a drying vessel 10 for performing a drying treatment and a mechanism supplying various types of gas to the drying vessel 10. FIGS. 2 and 3 are a plan view and a side elevational view of the drying vessel 10 respectively.

The drying vessel 10 is a box which can be brought into a closed space state by closing a lid (not shown). Substrates W are introduced into/discharged from the drying vessel 10 by a transporting robot (not shown) in a state opening the lid.

A cleaning bath 20 is fixed/arranged in the drying vessel 10. The cleaning bath 20 stores de-ionized water for dipping the substrates W in the de-ionized water thereby cleaning the substrates W. The cleaning bath 20 is provided with a de-ionized water supply mechanism (not shown) and a drain mechanism (not shown), which can supply new de-ionized water to the cleaning bath 20 and drain used de-ionized water from the cleaning bath 20 respectively. The cleaning bath 20 may be further provided with a mechanism for supplying·discharging a chemical solution such as an etching solution, in addition to those for the de-ionized water.

A lifter LH is provided in the drying vessel 10 (see FIGS. 2 and 3). The lifter LH has a function of vertically moving up/down a lifter arm 25. Three holding bars 26a, 26b and 26c are fixed to the lifter arm 25 so that the longitudinal direction thereof is substantially horizontal, while a plurality of holding grooves for receiving outer edge portions of the substrates W and holding the substrates W in an upright state are arranged on each of the three holding bars 26a, 26b and 26c at regular intervals.

Due to the aforementioned structure, the lifter LH can move the plurality of substrates W stacked/arranged in parallel with each other and held by the three holding bars 26a, 26b and 26c at intervals between positions dipped in the de-ionized water stored in the cleaning bath 20 and positions pulled up from the de-ionized water. A mechanism such as a feed screw mechanism employing ball screws or a belt mechanism employing pulleys and a belt can be employed for the lifter LH as the mechanism for moving up/down the lifter arm 25.

Further, two drying gas supply nozzles 30 and two nitrogen gas supply nozzles 50 are provided in the drying vessel 10. The two drying gas supply nozzles 30 and the two nitrogen gas supply nozzles 50 are hollow cylindrical members so arranged that the longitudinal direction thereof is substantially horizontal (in parallel with the three holding bars 26a, 26b and 26c). Each drying gas supply nozzle 30 is formed with a plurality of discharge holes 30a, and each nitrogen gas supply nozzle 50 is also formed with a plurality of discharge holes 50a (see FIG. 3).

The discharge holes 30a provided on the drying gas supply nozzles 30 are so formed that the discharge direction thereof is substantially horizontal. On the other hand, the discharge holes 50a provided on the nitrogen gas supply nozzles 50 are so formed that the discharge direction is obliquely downward. The discharge holes 30a are formed to be positioned between the plurality of substrates W arranged/held in parallel with each other by the three holding bars 26a, 26b and 26c of the lifter LH (see FIG. 3).

The drying gas supply nozzles 30 are supplied with drying gas from a drying gas supply mechanism provided outside the drying vessel 10. This drying gas supply mechanism is formed by a nitrogen gas supply source 32, a drying gas generation part 31, a pipe 35 and a heater 37. The drying gas generation part 31 stores liquid silicone.

Silicone, the general term for chain organopolysiloxane having a main chain of $(Si-O)_x$, includes liquid type, grease type, rubber type and resin type ones depending on the degrees of polymerization. The substrate dryer according to the first embodiment employs liquid type low-molecular silicone having a low degree of polymerization (low viscosity). This low-molecular silicone has the following structural formula:

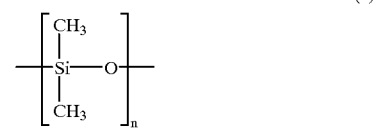

(1)

The low-molecular silicone in the present invention is in the range of a dimer to a pentamer (n: 2 to 5), and the substrate dryer according to the first embodiment employs a dimer. The degree of polymerization of the low-molecular silicone in the present invention is limited to the range of a dimer to a pentamer since silicone in this range is in a liquid state having low viscosity and hence can be readily supplied as drying gas by nitrogen bubbling described later. Throughout the specification, the term "low-molecular silicone" stands for that in the range of a dimer to a pentamer unless otherwise stated.

The nitrogen gas supply source 32 can supply nitrogen gas into the liquid silicone stored in the drying gas generation part 31 as bubbles, for performing the so-called bubbling with nitrogen gas. A gas phase of the silicone is mixed into the nitrogen gas due to this bubbling, so that drying gas consisting of silicone gas can be fed to the pipe 35 with carrier gas of the nitrogen gas. According to the first embodiment, the drying gas generation part 31 stores only the liquid silicone, and the drying gas consists of only the silicone gas. The concentration of the drying gas contained in the gas flowing through the pipe 35 may be set to about 2 volume %, and the flow velocity thereof may be set to about 10 l/min.

The heater 37 is provided on an intermediate portion of the path of the pipe 35, for heating the drying gas carried by the carrier gas. At this time, the heater 37 heats the drying gas to a temperature higher than that of the substrates W to be dried in the drying vessel 10 by at least 10° C. When the temperature of the substrates W to be dried is 23° C., for example, the heater 37 heats the drying gas to at least 33° C. The drying gas heated by the heater 37 is further fed to the drying gas supply nozzles 30 through the pipe 35, and supplied into the drying vessel 10 from the discharge holes 30a of the drying gas supply nozzles 30.

While the mode of supplying the drying gas from the drying gas supply nozzles 30 is further described later, the drying gas supply nozzles 30 are provided on side portions of the substrates W being pulled up from the cleaning bath 20 by the lifter LH, and hence it follows that the drying gas is supplied from the side portions of the substrates W being pulled up. The drying gas supply nozzles 30 substantially horizontally form streams of the drying gas on the gas-liquid interface of the de-ionized water stored in the cleaning bath 20 between the plurality of substrates W being pulled up.

On the other hand, the nitrogen gas supply source 52 provided outside the drying vessel 10 supplies nitrogen gas to the nitrogen gas supply nozzles 50. The nitrogen gas supply source 52 is connected with the nitrogen gas supply nozzles 50 through a pipe 55. A heater 57 is provided on an intermediate portion of the path of the pipe 55. The nitrogen gas fed from the nitrogen gas supply source 52 passes through the pipe 55, is heated by the heater 57 on the intermediate portion and thereafter reaches the nitrogen gas supply nozzles 50, to be obliquely downwardly discharged from the discharge holes 50a of the nitrogen gas supply nozzles 50.

The procedure of the drying treatment in the substrate dryer according to the first embodiment having the aforementioned structure is now described with reference to FIGS. 4 to 7. FIGS. 4 to 7 illustrate the process of the drying treatment in the aforementioned substrate dryer.

Figure 4:
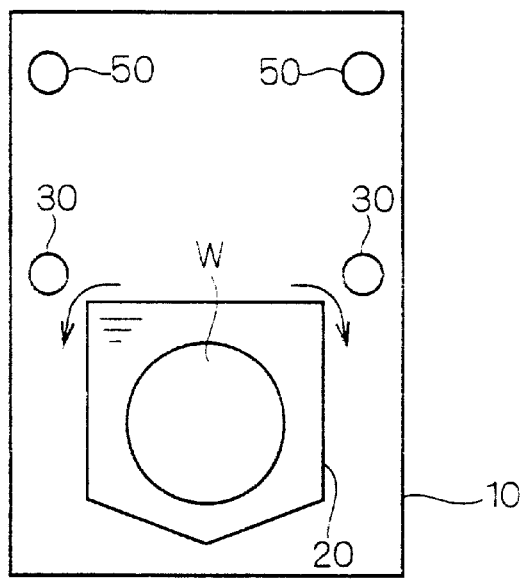
FIGS. 4 to 7 illustrate the process of a drying treatment in the substrate dryer shown in FIG. 1.

Referring to FIG. 4, the substrates W are subjected to a cleaning treatment (rinsing) with de-ionized water. In this rinsing, the lifter LH holds the plurality of substrates W stacked/arranged at intervals and dips the same in the de-ionized water stored in the cleaning bath 20. At this time, the de-ionized water is continuously supplied from a lower portion of the cleaning bath 20, to regularly overflow the cleaning bath 20 from its upper end (the so-called up-flow treatment). Thus, contaminants are separated from the substrates W and discharged from the cleaning bath 20. The used de-ionized water overflowing the cleaning bath 20 is collected and discharged from the drying vessel 10, as a matter of course. In advance of the rinsing, the substrates W may be subjected to a surface treatment with a chemical solution in the cleaning bath 20, or may be treated with a chemical solution in another vessel and introduced into the drying vessel 10.

In the stage of the rinsing, the drying gas supply nozzles 30 stop supplying the drying gas. On the other hand, the nitrogen gas supply nozzles 50 may supply the nitrogen gas to the drying vessel 10.

Figure 5:
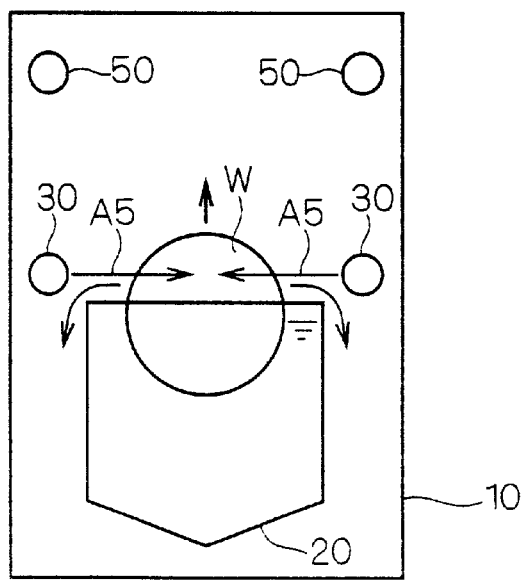

When the rinsing is terminated after a lapse of a prescribed time, the drying gas supply nozzles 30 start supplying the drying gas while the lifter LH collectively pulls up the held plurality of substrates W (FIG. 5). At this time, the drying gas supply nozzles 30 supply the drying gas from the side portions of the substrates W being pulled up from the cleaning bath 20 by the lifter LH, and substantially horizontally form streams of the drying gas on the gas-liquid interface of the de-ionized water stored in the cleaning bath 20 between the substrates W, as shown by arrows A5 in FIG. 5.

Large quantities of droplets of the de-ionized water adhere to the main surfaces of the substrates W being pulled up by the lifter LH, and the drying gas supply nozzles 30 supply the streams of the drying gas consisting of silicone gas to the main surfaces of the substrates W to which the de-ionized water adheres. The heater 37 heats the drying gas supplied from the drying gas supply nozzles 30 to a temperature higher than that of the pulled-up substrates W by at least 10° C. Therefore, the silicone gas is readily condensed on the main surfaces of the respective ones of the plurality of substrates W, so that the liquid silicone substitutes for the droplets and adheres to the surfaces of the substrates W.

Also in the stage of pulling up the substrates W by the lifter LH, the de-ionized water is continuously supplied to the cleaning bath 20 from the lower portion thereof while overflowing the cleaning bath 20 from its upper end, for discharging impurities from the cleaning bath 20.

Figure 6:
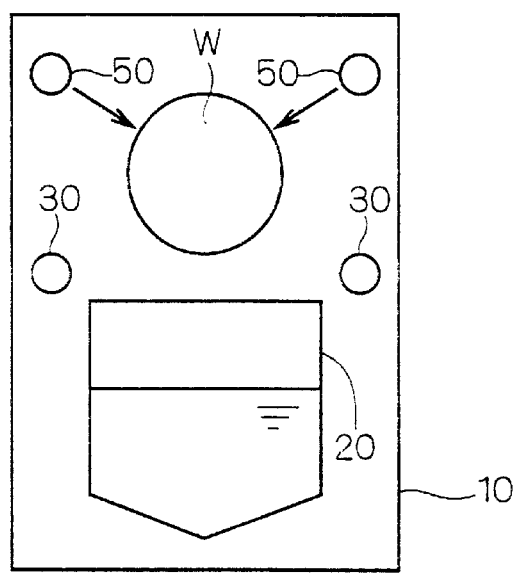

Then, the lifter LH completely separates the substrates W from the de-ionized water stored in the cleaning bath 20, and the drying gas supply nozzles 30 stop supplying the drying gas while the nitrogen gas supply nozzles 50 supply the nitrogen gas or the nitrogen gas heated by the heater 57 (FIG. 6). Thus, the inactive nitrogen gas substitutes for the atmosphere in the drying vessel 10, and silicone adhering to the substrates W vaporizes. Particularly when the heated nitrogen gas is sprayed to the substrates W, vaporization of silicone is prompted for reducing the drying time. In this stage, supply of the de-ionized water to the cleaning bath 20 is stopped while the used de-ionized water is discharged from the cleaning bath 20.

Figure 7:
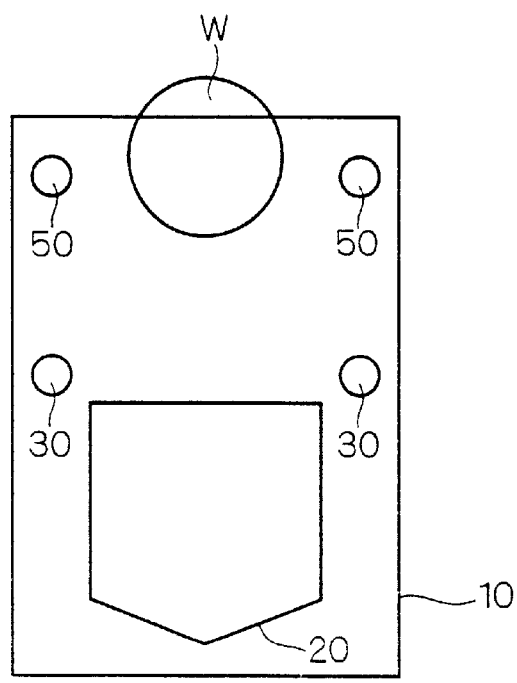

Thereafter the nitrogen gas supply nozzles 50 stop supplying the nitrogen gas after the silicone adhering to the substrates W completely vaporizes, and the lid of the drying vessel 10 is opened for discharging the dried substrates W from the drying vessel 10 (FIG. 7). Thus, the series of treatments of the substrates W is terminated.

As hereinabove described, the substrate dryer according to the first embodiment supplies the streams of the low-molecular silicone gas to the main surfaces of the substrates W to which de-ionized water adheres, and condenses the silicone gas on the main surfaces for replacing the droplets of the de-ionized water with the silicone thereby drying the substrates W. Silicone, also employed for cosmetics or the like, is a material applying only light load to the environment and causing no problem such as disruption of the ozone layer or global warming, which requires no specific treatment in disposal. Thus, increase of the cost required for the drying treatment can be suppressed.

Further, the low-molecular silicone has small surface tension of not more than 16.5 dyn/cm while those of water and IPA are 71.8 dyn/cm and 20.8 dyn/cm respectively. This means that the low-molecular silicone having small surface tension has higher permeability than IPA. Thus, the low-molecular silicone can readily substitute for moisture also in the recent refined·complicated device structure, particularly in a portion such as a hole having a large aspect ratio (the ratio of the length to the diameter).

Therefore, the drying method employing the low-molecular silicone exhibits excellent dryability also in the recent refined·complicated device structure, and hardly causes the problem of a water mark resulting from adhering moisture.

Further, the low-molecular silicon also has small latent heat of vaporization of not more than 300 J/g while those of water and IPA are 2256 J/g and 674 J/g respectively.

This means that the low-molecular silicone having small latent heat of vaporization has a higher drying speed than IPA. Therefore, the drying method employing the low-molecular silicone can reduce the time required for drying as compared with the case of employing IPA, improve the throughput, and further suppress formation of a water mark resulting from adhering moisture.

According to the first embodiment, the drying gas supply nozzles 30 supply the drying gas of the low-molecular silicone from the side portions of the substrates W being pulled up from the cleaning bath 20 by the lifter LH and substantially horizontally form the streams of the drying gas on the gas-liquid interface of the de-ionized water stored in the cleaning bath 20, thereby spraying the drying gas to separated areas substantially simultaneously with separation of the surfaces of the substrates W from the de-ionized water. Thus, the moisture on the main surfaces of the substrates W are hardly exposed to the outside air but quickly replaced with the low-molecular silicone, and formation of a water mark can be more efficiently suppressed.

Part of the supplied drying gas drops into the cleaning bath 20 to be mixed with the de-ionized water at this time, while the silicone is water-insoluble, completely separated from water and causes no Marangoni convection, to cause no problem such as transfer of particles resulting from a Marangoni convection.

The drying gas supply nozzles 30 forming the streams of the drying gas between the plurality of substrates W being pulled up by the lifter LH can homogeneously spray the drying gas of the low-molecular silicone to the respective substrates W.

Further, the heater 37 heats the drying gas to a temperature higher than that of the pulled-up substrates W by at least 10° C., whereby the low-molecular silicone is readily condensed on the main surfaces of the substrates W so that the liquid silicone can quickly substitute for the droplets adhering to the substrates W and formation of a water mark can be more effectively suppressed as a result.

While the first embodiment of the present invention has been described, the present invention is not restricted to the aforementioned example. While the substrate dryer according to the aforementioned first embodiment stores only the liquid low-molecular silicone in the drying gas generation part 31 for forming the drying gas only by the silicone gas, the drying gas generation part 31 may alternatively store a mixed solution of liquid low-molecular silicone and a water-soluble solvent for preparing the drying gas from a gas mixture of the silicone gas and gas of the water-soluble solvent. The water-soluble solvent can be prepared from alcohol such as IPA, acetone, ketone or carboxylic acid, for example. The content of the gas of the water-soluble solvent in the mixed drying gas must be not more than 10 volume %. If the content of the gas of the water-soluble solvent in the mixed drying gas exceeds 10 volume %, the ratio of the silicone gas in the mixed drying gas is so reduced that the aforementioned effect resulting from employment of silicone is hard to attain and a specific problem (a problem of disposal or the like) results from employment of IPA or the like. Such a problem hardly arises when the content of the gas of the water-soluble solvent in the mixed drying gas is not more than 10 volume %.

While the substrate dryer according to the first embodiment generates the drying gas by bubbling the nitrogen gas, the drying gas generation method is not restricted to this but the drying gas generation part 31 may be provided with a heater for heating liquid silicone (or a mixed solution of liquid silicone and a water-soluble solvent) thereby generating drying gas, for example.

While the substrate dryer according to the first embodiment heats the drying gas by the heater 37 to a temperature higher than that of the substrates W to be dried by at least 10° C., the drying gas may not necessarily be heated. When the drying gas is not heated, the temperatures of the substrates W and the drying gas are substantially equivalent to each other to more hardly cause condensation than the first embodiment, and hence the speed for pulling up the substrates W by the lifter LH must be reduced (to about 1 mm/sec.) as compared with the first embodiment. When reducing the speed for pulling up the substrates W, condensation of silicone is caused without heating the drying gas, and an effect similar to that of the first embodiment can be attained.

While the drying gas supply nozzles 30 are provided on the side portions of the substrates W being pulled up from the cleaning bath 20 by the lifter LH in the first embodiment, the present invention is not restricted to this but the drying gas supply nozzles 30 may be located on positions capable of supplying streams of the drying gas to the main surfaces of the substrates W.

While the substrate dryer according to the first embodiment is the so-called batch-system apparatus collectively treating the plurality of substrates W, the technique of the aforementioned embodiment is also applicable to the so-called sheet-feed apparatus treating the substrates W one by one.

<Second Embodiment>

A substrate dryer according to a second embodiment of the present invention is now described. The basic structure of the substrate dryer according to the second embodiment is absolutely identical to that of the first embodiment (see FIGS. 1 to 3).

The substrate dryer according to the second embodiment is different from the first embodiment in a point that the same employs gas of a fluorine-based inactive liquid as drying gas in place of the low-molecular silicone. In other words, a drying gas generation part 31 stores the fluorine-based inactive liquid in place of the liquid silicone.

The fluorine-based inactive liquid is an inactive material not corroding a material such as a metal, plastic or rubber, nonflammable and applies no load to the environment. The fluorine-based inactive liquid employed in the present invention has the following general structural formula:

$$[C_{(n)}F_{(2n+1)}\text{—O—}R_1] \qquad (2)$$

where $R_1$ represents an alkyl group, and n represents a natural number. The substrate dryer according to the present invention employs ethyl perfluorobutyl ether as the fluorine-based inactive liquid. This ethyl perfluorobutyl ether has the following structural formula:

$$[C_4F_9\text{—O—}C_2H_5] \qquad (3)$$

A nitrogen gas supply source 32 can supply nitrogen gas to the fluorine-based inactive liquid stored in the drying gas generation part 31 as bubbles, for performing the so-called bubbling with the nitrogen gas. Due to this bubbling, a gas phase of the fluorine-based inactive liquid is mixed into the nitrogen gas, so that drying gas consisting of gas of the fluorine-based inactive liquid can be fed to a pipe 35 with carrier gas of the nitrogen gas. According to the second embodiment, the drying gas generation part 31 stores only the fluorine-based inactive liquid, and the drying gas is prepared from only the gas of the fluorine-based inactive liquid. The concentration of the drying gas in the gas flowing through the pipe 35 may be set to about 2 volume %, and the flow velocity thereof may be set to about 10 l/min.

The remaining structure of the substrate dryer according to the second embodiment is identical to that of the substrate dryer according to the first embodiment, and hence redundant description is omitted. The procedure of a drying treatment in the substrate dryer according to the second embodiment is also identical to that of the first embodiment (see FIGS. 4 to 7). In other words, after the stage of the rinsing, large quantities of droplets of de-ionized water adhere to the main surfaces of substrates W being pulled up by a lifter LH, and drying gas supply nozzles 30 supply streams of the drying gas consisting of the gas of the fluorine-based inactive liquid to the main surfaces of the substrates W. A heater 37 heats the drying gas supplied from the drying gas supply nozzles 30 to a temperature higher than that of the pulled-up substrates W by at least 10° C. Therefore, the gas of the fluorine-based inactive liquid is readily condensed on the main surfaces of the respective ones of the plurality of substrates W, so that the fluorine-based inactive liquid substitutes for the droplets and adheres to the surfaces of the substrates W.

Then, the lifter LH completely separates the substrates W from the de-ionized water stored in a cleaning bath 20, and the drying gas supply nozzles 30 stop supplying the drying gas while nitrogen gas supply nozzles 50 supply nitrogen gas or the nitrogen gas heated by a heater 57. Thus, the inactive nitrogen gas substitutes for the atmosphere in a drying vessel 10, and the fluorine-based inactive liquid adhering to the substrates W vaporizes. Particularly when the heated nitrogen gas is sprayed to the substrates W, vaporization of the fluorine-based inactive gas is prompted for reducing the drying time. In this stage, supply of the de-ionized water to the cleaning bath 20 is stopped while the used de-ionized water is discharged from the cleaning bath 20.

Thereafter the nitrogen gas supply nozzles 50 stop supplying the nitrogen gas after the fluorine-based inactive liquid adhering to the substrates W completely vaporizes, and a lid of the drying vessel 10 is opened for discharging the dried substrates W from the drying vessel 10. Thus, the serial drying treatment of the substrates W is terminated.

As hereinabove described, the substrate dryer according to the second embodiment supplies the streams of the gas of the fluorine-based inactive liquid to the main surfaces of the substrates W to which de-ionized water adheres, and condenses the gas of the fluorine-based inactive liquid on the main surfaces for replacing the droplets of de-ionized water with the fluorine-based inactive liquid thereby drying the substrates W. The fluorine-based inactive liquid, also employed as substitutional flon, is a material applying only light load to the environment and causing no problem such as disruption of the ozone layer or global warming, which requires no specific treatment in disposal. Thus, increase of the cost required for the drying treatment can be suppressed.

Further, the fluorine-based inactive liquid and the gas thereof are nonflammable, and hence the dryer may not be provided with a specific safety mechanism such as an explosion-proof structure. Increase of the cost required for the drying treatment can be suppressed also by this.

In addition, the fluorine-based inactive liquid has small surface tension of not more than 18 dyn/cm while those of water and IPA are 71.8 dyn/cm and 20.8 dyn/cm respectively. This means that the fluorine-based inactive liquid having small surface tension has higher permeability than IPA. Thus, the fluorine-based inactive liquid can readily substitute for moisture also in the recent refined·complicated device structure particularly in a portion such as a hole having a large aspect ratio (the ratio of the length to the diameter). Therefore, the drying method employing the fluorine-based inactive liquid exhibits excellent dryability also in the recent refined·complicated device structure, and hardly causes the problem of a water mark resulting from adhering moisture.

Further, the fluorine-based inactive liquid also has small latent heat of vaporization of not more than 84 J/g while those of water and IPA are 2256 J/g and 674 J/g respectively. This means that the fluorine-based inactive liquid having small latent heat of vaporization has a higher drying speed than IPA. Therefore, the drying method employing the fluorine-based inactive liquid can reduce the time required for drying as compared with the case of employing IPA, improve the throughput, and further suppress formation of a water mark resulting from adhering moisture.

According to the second embodiment, the drying gas supply nozzles 30 supply the drying gas of the fluorine-based inactive liquid from the side portions of the substrates W being pulled up from the cleaning bath 20 by the lifter LH and substantially horizontally form the streams of the drying gas on the gas-liquid interface of the de-ionized water stored in the cleaning bath 20, thereby spraying the drying gas to separated areas substantially simultaneously with separation of the surfaces of the substrates W from the de-ionized water. Thus, it follows that the moisture on the main surfaces of the substrates W are hardly exposed to the outside air but quickly replaced with the fluorine-based inactive liquid, and formation of a water mark can be more efficiently suppressed.

Part of the supplied drying gas drops into the cleaning bath 20 to be mixed with the de-ionized water at this time, while the fluorine-based inactive liquid is water-insoluble, completely separated from water and causes no Marangoni convection, to cause no problem such as transfer of particles resulting from a Marangoni convection.

The drying gas supply nozzles 30 forming the streams of the drying gas between the plurality of substrates W being pulled up by the lifter LH can homogeneously spray the drying gas of the fluorine-based inactive liquid to the respective substrates W.

Further, the heater 37 heats the drying gas to a temperature higher than that of the pulled-up substrates W by at least 10° C., whereby the fluorine-based inactive liquid is readily condensed on the main surfaces of the substrates W so that the droplets adhering to the substrates W can be quickly replaced with the fluorine-based inactive liquid and formation of a water mark can be more effectively suppressed as a result.

While the second embodiment of the present invention has been described, the present invention is not restricted to the aforementioned example. While the substrate dryer according to the aforementioned second embodiment stores only the fluorine-based inactive liquid in the drying gas generation part 31 for forming the drying gas only by the gas of the fluorine-based inactive liquid, the drying gas generation part 31 may alternatively store a mixed solution of the fluorine-based inactive liquid and a water-soluble solvent for preparing the drying gas from a gas mixture of the gas of the fluorine-based inactive liquid and gas of the water-soluble solvent. The water-soluble solvent can be prepared from alcohol such as IPA, acetone, ketone or carboxylic acid, for example. The content of the gas of the water-soluble solvent in the mixed drying gas must be not more than 10 volume %. If the content of the gas of the water-soluble solvent in the mixed drying gas exceeds 10 volume %, the ratio of the gas of the fluorine-based inactive liquid in the mixed drying gas is so reduced that the aforementioned effect resulting from employment of the fluorine-based inactive liquid is hard to attain and a specific problem (a problem of disposal or the like) results from employment of IPA or the like. Such a problem hardly arises when the content of the gas of the water-soluble solvent in the mixed drying gas is not more than 10 volume %.

While the substrate dryer according to the second embodiment generates the drying gas by bubbling the nitrogen gas, the drying gas generation method is not restricted to this but the drying gas generation part 31 may be provided with a heater for heating the fluorine-based inactive liquid (or a mixed solution of the fluorine-based inactive liquid and a water-soluble solvent) thereby generating drying gas, for example.

While the substrate dryer according to the second embodiment heats the drying gas by the heater 37 to a temperature higher than that of the substrates W to be dried by at least 10° C., the drying gas may not necessarily be heated. When the drying gas is not heated, the temperatures of the substrates W and the drying gas are substantially equivalent to each other to more hardly cause condensation than the second embodiment, and hence the speed for pulling up the substrates W by the lifter LH must be reduced (to about 1 mm/sec.) as compared with the aforementioned embodiment. When reducing the speed for pulling up the substrates W, condensation of the fluorine-based inactive liquid is caused without heating the drying gas, and an effect similar to that of the aforementioned embodiment can be attained.

While the drying gas supply nozzles 30 are provided on the side portions of the substrates W being pulled up from the cleaning bath 20 by the lifter LH in the second embodiment, the present invention is not restricted to this but the drying gas supply nozzles 30 may be located on positions capable of supplying the streams of the drying gas to the main surfaces of the substrates W.

While the fluorine-based inactive liquid is prepared from ethyl perfluorobutyl ether in the second embodiment, the fluorine-based inactive liquid is not restricted to this but may be prepared from methyl perfluoroisobutyl ether, ethyl perfluorobutyl ether, ethyl perfluoroisobutyl ether, propyl perfluorobutyl ether, propyl perfluoroisobutyl ether, methyl perfluoropropyl ether, methyl perfluoroisopropyl ether, ethyl perfluoropropyl ether, ethyl perfluoroisopropyl ether, methyl perfluoropentyl ether or ethyl perfluoropentyl ether, for example, if they include the structure as shown in the chemical formula (2).

While the substrate dryer according to the second embodiment is the so-called batch-system apparatus collectively treating the plurality of substrates W, the technique of the second embodiment is also applicable to the so-called sheet-feed apparatus treating the substrates W one by one.

<Third Embodiment>

Figure 8:
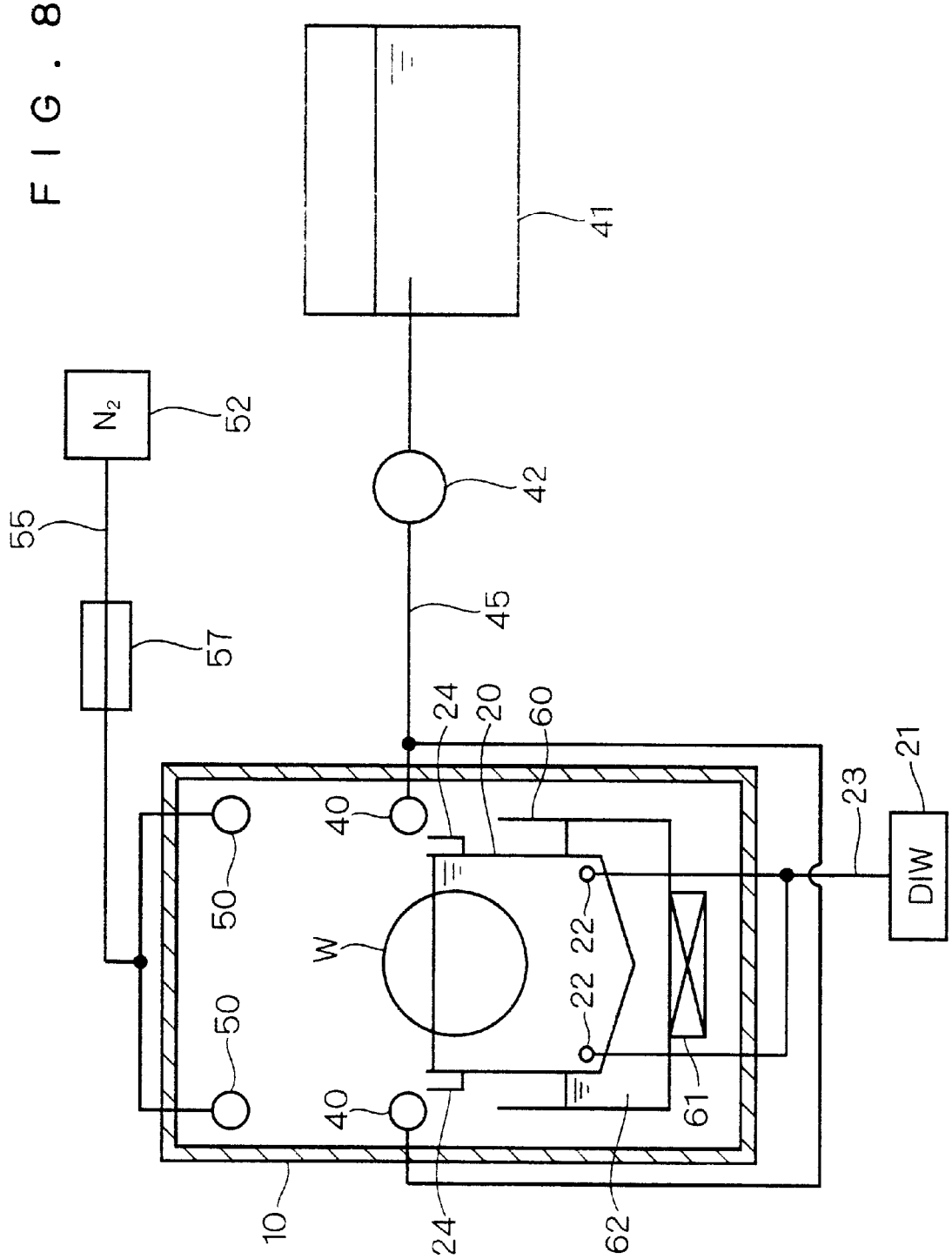
FIG. 8 illustrates the overall structure of a substrate dryer according to a third embodiment of the present invention.
Figure 9:
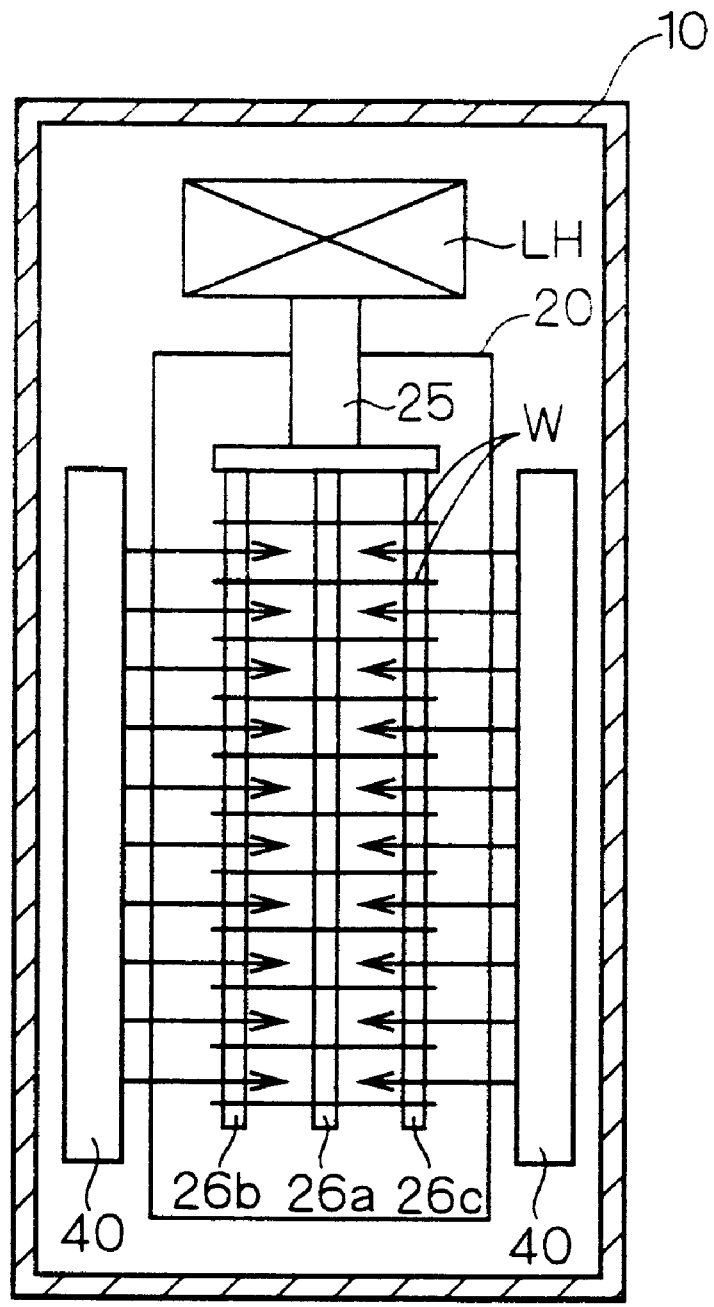
FIG. 9 is a plan view of a drying vessel in the substrate dryer shown in FIG. 8.
Figure 10:
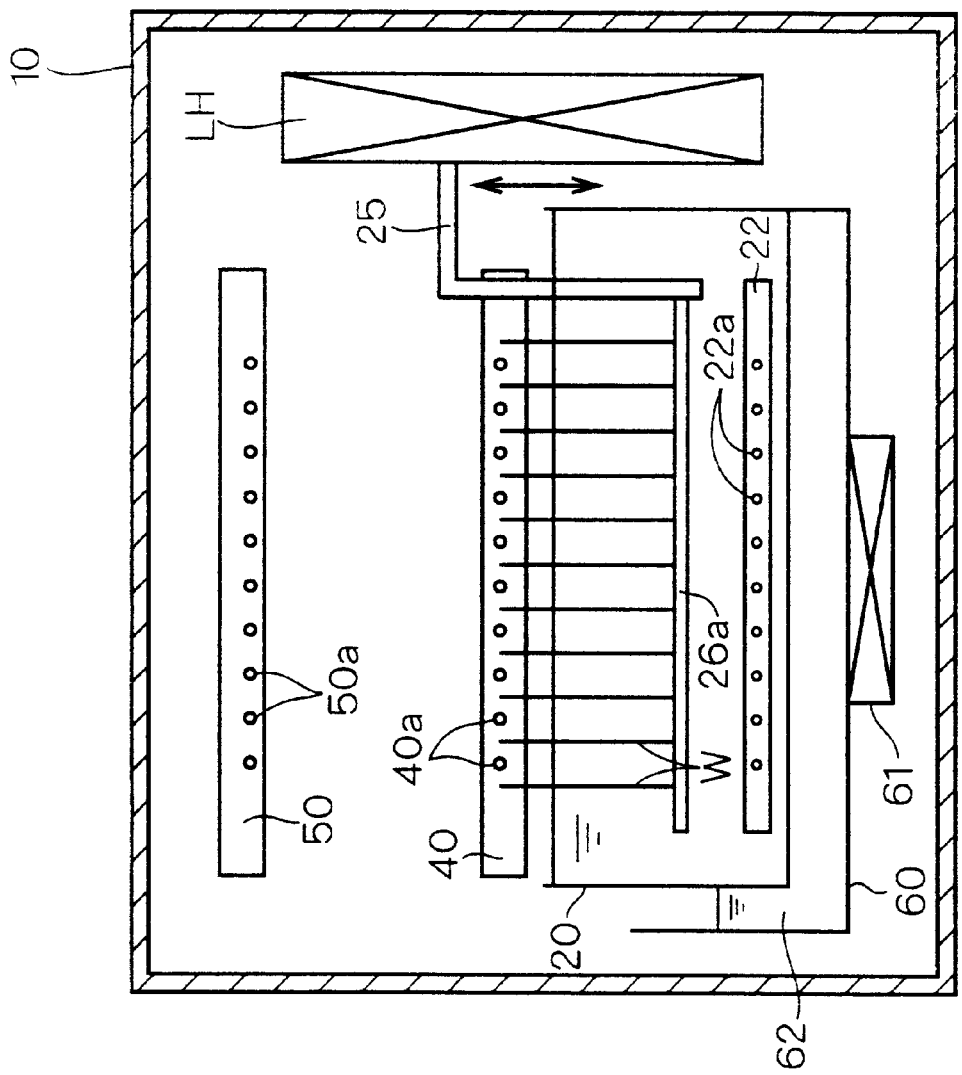
FIG. 10 is a side elevational view of the drying vessel in the substrate dryer shown in FIG. 8.

A substrate dryer according to a third embodiment of the present invention is now described. FIG. 8 illustrates the overall structure of the substrate dryer according to the third embodiment of the present invention. This substrate dryer is generally formed by a drying vessel 10 for drying and a mechanism supplying various types of gas and liquid to the drying vessel 10. FIGS. 9 and 10 are a plan view and a side elevational view of the drying vessel 10 respectively.

The drying vessel 10 is a box which can be brought into a closed space state by closing a lid (not shown). Substrates W are introduced into/discharged from the drying vessel 10 by a transporting robot (not shown) in a state opening the lid.

A cleaning bath 20 is fixed/arranged in the drying vessel 10. The cleaning bath 20 stores de-ionized water for dipping the substrates W in the de-ionized water thereby cleaning the substrates W. Two de-ionized water supply nozzles 22 are arranged on the inner bottom portion of the cleaning bath 20. The de-ionized water supply nozzles 22 are so provided that the longitudinal direction thereof is substantially horizontal, and connected with a de-ionized water supply source 21 provided outside the drying vessel 10 through a pipe 23.

Each de-ionized water supply nozzle 22 is provided with a plurality of discharge holes 22a (see FIG. 10). Fresh de-ionized water fed from the de-ionized water supply source 21 flows through the pipe 23 and reaches the de-ionized water supply nozzles 22, to be discharged into the cleaning bath 20 from the discharge holes 22a of the de-ionized water supply nozzles 22. The discharge holes 22a are directed obliquely upward, for discharging the de-ionized water supplied from the de-ionized water supply nozzles 22 obliquely upward (toward a portion around the center of the cleaning bath 20).

The de-ionized water supplied from the de-ionized water supply nozzles 22 is stored in the cleaning bath 20, to finally overflow the cleaning bath 20 from its upper end. The de-ionized water overflowing the cleaning bath 20 from the upper end flows into a collecting part 24 (see FIG. 8: description of the collecting part 24 is omitted in FIGS. 9 and 10 for convenience of illustration). The collecting part 24 is connected to a discharge mechanism (not shown), so that the de-ionized water flowing into the collecting part 24 is discharged from the apparatus through the discharge mechanism.

An outer bath 60 is provided in the drying vessel 10 outside the cleaning bath 20. The outer bath 60 is a container of stainless steel, for example, and an ultrasonic vibration source 61 having an ultrasonic vibrator is provided on its outer bottom portion. The clearance between the outer bath 60 and the cleaning bath 20 is filled with propagation water 62. Thus, ultrasonic vibration of the megahertz band generated from the ultrasonic vibration source 61 is transmitted to the cleaning bath 20 through the propagation water 62, and supplied to the de-ionized water and the substrates W dipped therein through the cleaning bath 20. The ultrasonic vibration source 61 is not directly provided on the cleaning bath 20 since the ultrasonic vibration source 61 cannot be brought into direct contact with the cleaning bath 20 of quartz. The ultrasonic vibration from the ultrasonic vibration source 61 is not restricted to the megahertz band, as a matter of course.

A lifter LH is provided in the drying vessel 10 (see FIGS. 9 and 10). The lifter LH has a function of vertically moving up/down a lifter arm 25. Three holding bars 26a, 26b and 26c are fixed to the lifter arm 25 so that the longitudinal direction thereof is substantially horizontal (parallel to the de-ionized water supply nozzles 22), while a plurality of holding grooves for receiving outer edge portions of the substrates W and holding the substrate W in an upright state are arranged on each of the three holding bars 26a, 26b and 26c at regular intervals.

Due to the aforementioned structure, the lifter LH can move the plurality of substrates W stacked/arranged in parallel with each other and held by the three holding bars 26a, 26b and 26c between positions dipped in the de-ionized water stored in the cleaning bath 20 and positions pulled up from the de-ionized water. A mechanism such as a feed screw mechanism employing ball screws or a belt mechanism employing pulleys and a belt can be employed for the lifter LH as the mechanism for moving up/down the lifter arm 25.

Further, two drying liquid supply nozzles 40 and two nitrogen gas supply nozzles 50 are provided in the drying vessel 10. The two drying liquid supply nozzles 40 and the two nitrogen gas supply nozzles 50 are hollow cylindrical members so arranged that the longitudinal direction thereof is substantially horizontal (in parallel with the three holding bars 26a, 26b and 26c). Each drying liquid supply nozzle 40 is formed with a plurality of discharge holes 40a, and each nitrogen gas supply nozzle 50 is also formed with a plurality of discharge holes 50a (see FIG. 10).

The discharge holes 40a provided on the drying liquid supply nozzles 40 are so formed that the discharge direction thereof is substantially horizontal. On the other hand, the discharge holes 50a provided on the nitrogen gas supply nozzles 50 are so formed that the discharge direction thereof is obliquely downward. The discharge holes 40a are located between the plurality of substrates W arranged/held by the three holding bars 26a, 26b and 26c in parallel with each other respectively (see FIG. 10).

The drying liquid supply nozzles 40 are supplied with a drying liquid from a drying liquid supply mechanism provided outside the drying vessel 10. This drying liquid supply mechanism is formed by a drying liquid vessel 41, a feed pump 42 and a pipe 45. The drying liquid vessel 41 stores liquid silicone.

As described with reference to the first embodiment, silicone, the general term for chain organopolysiloxane having a main chain of $(Si-O)_x$, includes liquid type, grease type, rubber type and resin type ones depending on the degrees of polymerization. The substrate dryer according to the third embodiment employs liquid type low-molecular silicone having a low degree of polymerization (low viscosity). The structural formula of the low-molecular silicone is identical to the chemical formula (1) described above with reference to the first embodiment.

The low-molecular silicone in the present invention is in the range of a dimer to a pentamer (n: 2 to 5), and the substrate dryer according to the third embodiment employs a dimer. The degree of polymerization of the low-molecular silicone in the present invention is limited to the range of a dimer to a pentamer since the silicone in this range is in a liquid state having low viscosity and hence can be readily supplied as the drying liquid by the feed pump 42 in the third embodiment.

The feed pump 42 feeds the liquid silicone stored in the drying liquid vessel 41 to the drying liquid supply nozzles 40 through the pipe 45 as the drying liquid. The drying liquid fed to the drying liquid supply nozzles 40 are discharged into the cleaning bath 20 from the discharge holes 40a of the drying liquid supply nozzles 40 in the form of mist. According to this embodiment, the drying liquid vessel 41 stores only the liquid silicone, and the drying liquid is made of only silicone.

While the behavior of the drying liquid supplied to the cleaning bath 20 is further described later, water-insoluble silicone having smaller specific gravity than water forms a thin liquid layer of silicone on the surface of the de-ionized water stored in the cleaning bath 20.

On the other hand, the nitrogen gas supply source 52 provided outside the drying vessel 10 feeds nitrogen gas to the nitrogen gas supply nozzles 50. The nitrogen gas supply source 52 is connected with the nitrogen gas supply nozzles 50 through a pipe 55. A heater 57 is provided on an intermediate portion of the path of the pipe 55. The nitrogen gas fed from the nitrogen gas supply source 52 passes through the pipe 55, is heated by the heater 57 on the intermediate portion and thereafter reaches the nitrogen gas supply nozzles 50, to be obliquely downwardly discharged from the discharge holes 50a of the nitrogen gas supply nozzles 50.

The procedure of a drying treatment in the substrate dryer according to the third embodiment having the aforementioned structure is now described with reference to FIGS. 11 to 15. FIGS. 11 to 15 illustrate the process of the drying treatment in the substrate dryer according to the third embodiment.

Figure 11:
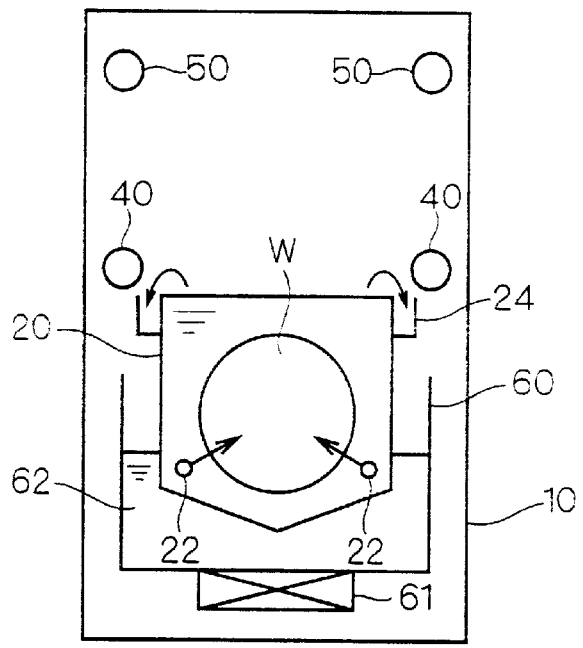
FIGS. 11 to 15 illustrate the process of a drying treatment in the substrate dryer shown in FIG. 8.

Referring to FIG. 11, the substrates W are subjected to a cleaning treatment (rinsing) with de-ionized water. In this rinsing, the lifter LH holds the plurality of substrates W stacked/arranged at intervals, and dips the same in the de-ionized water stored in the cleaning bath 20. At this time, the de-ionized water is continuously supplied from the de-ionized water supply nozzles 22 into the cleaning bath 20 to regularly overflow the cleaning bath 20 from its upper end (the so-called up-flow treatment). Thus, contaminants such as particles are separated from the substrates W and discharged from the cleaning bath 20, so that the substrates W are cleaned. The used de-ionized water overflowing the cleaning bath 20 flows into a collecting part 24 and is collected, to be discharged from the drying vessel 10. In advance of the rinsing, the substrates W may be subjected to a surface treatment with a chemical solution in the cleaning bath 20, or the substrates W may be treated with a chemical solution in another vessel and introduced into the drying vessel 10.

In the stage of the rinsing, the drying liquid supply nozzles 40 supply no drying liquid. On the other hand, the nitrogen gas supply nozzles 50 may supply the nitrogen gas to the drying vessel 10, for executing the rinsing under a nitrogen atmosphere.

Figure 12:
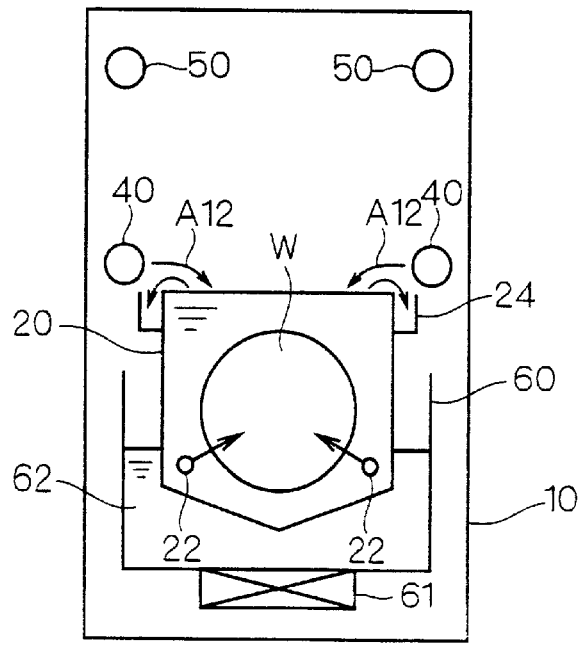

When the rinsing is terminated after a lapse of a prescribed time, the drying liquid supply nozzles 40 start supplying the drying liquid before pulling up substrates W (FIG. 12). The drying liquid is supplied from the drying liquid supply nozzles 40 into the cleaning bath 20 in the form of mist, as shown by arrows A12 in FIG. 12. As described above, the drying liquid is made of only silicone in this embodiment. The supplied water-insoluble silicone having smaller specific gravity than water completely separates from the de-ionized water and forms a thin liquid silicone layer on the surface of the de-ionized water stored in the cleaning bath 20.

In this stage, the substrates W remain on the same positions as those in the rinsing, while the de-ionized water is continuously supplied from the de-ionized water supply nozzles 22 to overflow the cleaning bath 20 from the upper end. While the silicone layer formed on the surface of the de-ionized water also overflows the cleaning bath 20 from the upper end along with the de-ionized water, the drying liquid supply nozzles 40 continuously supply the drying liquid and hence the silicone layer is regularly formed on the surface of the de-ionized water stored in the cleaning bath 20.

Figure 13:
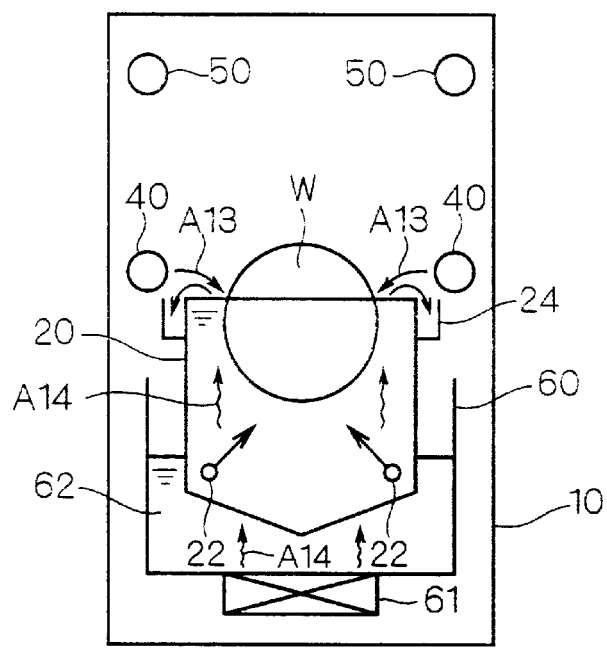

After the silicone layer is formed on the surface of the de-ionized water stored in the cleaning bath 20, the lifter LH collectively pulls up the cleaned plurality of substrates W held by the same (FIG. 13). Also in this stage, the de-ionized water is continuously supplied from the de-ionized water supply nozzles 22 to overflow the cleaning bath 20 from the upper end at least while the substrates W pass through the silicone layer. Further, the drying liquid supply nozzles 40 continuously supply the drying liquid as shown by arrows A13 and the ultrasonic vibration source 61 performs ultrasonic oscillation as shown by arrows A14 at least while the substrates W pass through the silicone layer.

Also when the substrates W are pulled up, the drying liquid is continuously supplied while the liquid layer of silicone flows out from the upper end of the cleaning bath 20 along with the de-ionized water, and hence the silicone layer is regularly formed on the surface of the de-ionized water stored in the cleaning bath 20. Therefore, the plurality of substrates W pulled by the lifter LH pass through the silicon layer formed on the surface of the de-ionized water. Further, the ultrasonic vibration source 61 supplies ultrasonic vibration to the de-ionized water stored in the cleaning bath 20, the silicone layer formed on the surface of the de-ionized water and the pulled-up substrates W through the propagation water 62.

Figure 16:
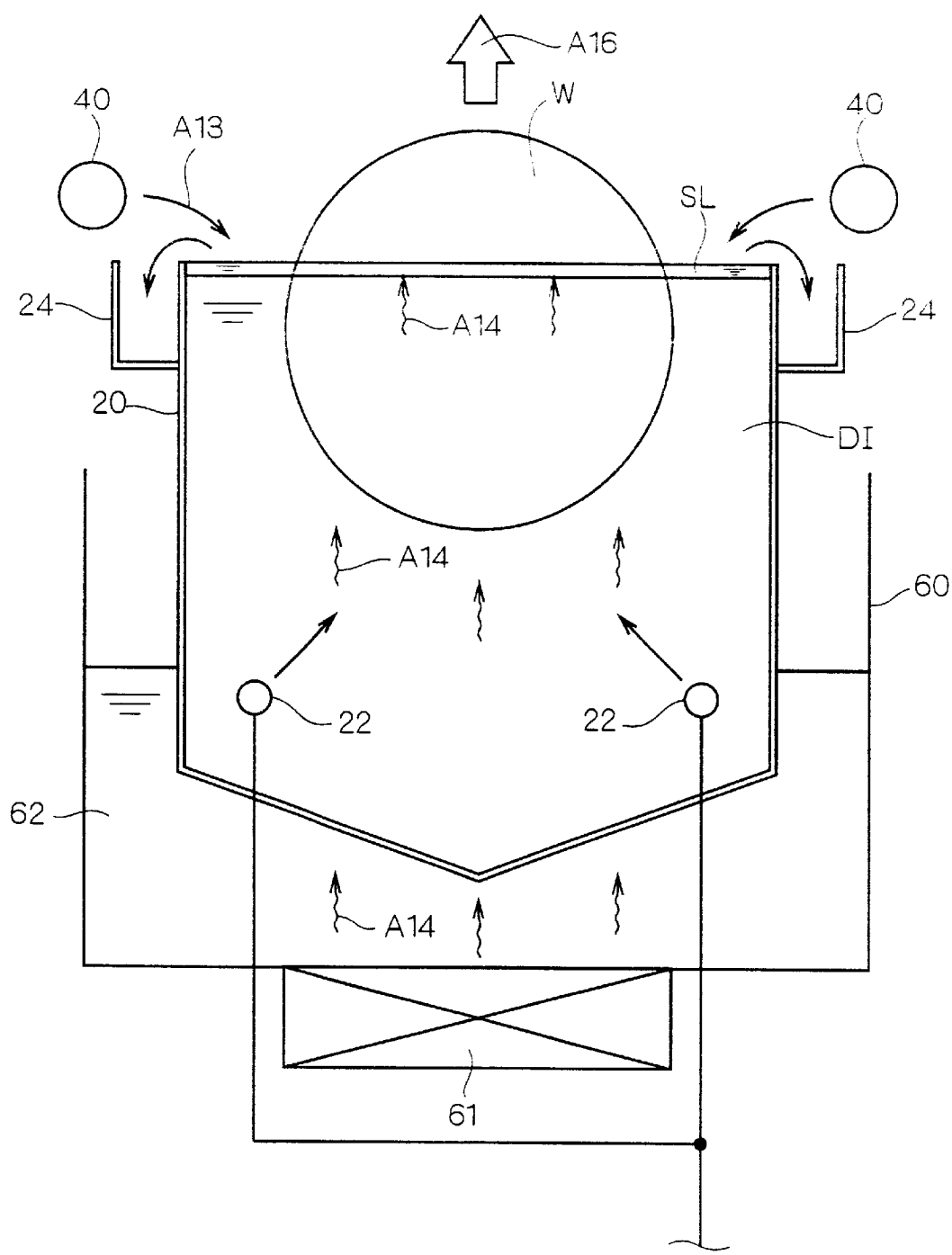
FIG. 16 illustrates a substrate being pulled up and passed through a silicone layer.

FIG. 16 illustrates the pulled-up substrates W passing through the silicone layer. A liquid silicone layer SL is formed on the surface of de-ionized water DI stored in the cleaning bath 20. The substrates W are pulled upward as shown by arrow A16 in FIG. 16. Thus, the substrates W pass through the silicone layer SL successively from the upper end. When the substrates W are present in the de-ionized water DI, the surfaces thereof are in contact with the water, as a matter of course. When the substrates W pass through the silicone layer SL, the liquid silicone forming the silicone layer SL adheres to the surfaces of the substrates W in place of moisture having been in contact therewith.

When the substrates W are pulled up, the ultrasonic vibration source 61 supplies ultrasonic vibration as shown by arrows A14 in FIG. 16. This ultrasonic vibration is propagated also to boundary portions between the silicone layer SL, the de-ionized water DI and the substrates W, to contribute to separation of the water layer which is in contact with the surfaces of the substrates W. In other words, the ultrasonic vibration from the ultrasonic vibration source 61 prompts replacement of the liquid silicone with the moisture having been in contact with the surfaces of the substrates W.

Thus, the moisture having been in contact with the surfaces of the substrates W is completely replaced with silicone, so that only the liquid silicone adheres to the surfaces of the substrates W exposed in the air (the surfaces of the substrates W located above the silicone layer SL in FIG. 16).

The moisture separated by the aforementioned replacement floats in the silicone layer SL as a number of fine droplets, and the replacement efficiency with silicone is reduced if the quantity of such fine droplets is excessively increased. According to the third embodiment, however, the up-flow treatment is continuously performed also when pulling up the substrates W at least while the substrates W pass through the silicone layer SL as described above, and the silicone layer SL gradually flows out from the upper end of the cleaning bath 20 to flow into the collecting part 24. Therefore, the fine droplets floating in the silicone layer SL are successively discharged from the cleaning bath 20. Thus, the quantity of the fine droplets floating in the silicone layer SL is suppressed below a constant level, for maintaining the replacement efficiency with the silicone.

Figure 14:
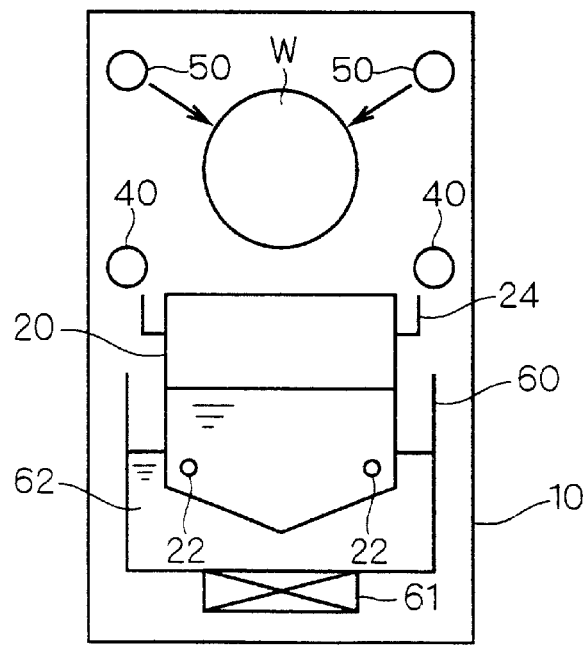

When the lifter LH completely separates the substrates W from the cleaning bath 20, the drying liquid supply nozzles 40 stop supplying the drying liquid while the nitrogen gas supply nozzles 50 supply nitrogen gas or nitrogen gas heated by the heater 57 (FIG. 14). Thus, the inactive nitrogen gas supplied from the nitrogen gas supply nozzles 50 substitutes for the atmosphere in the drying vessel 10 while the silicone adhering to the substrates W vaporizes. Particularly when heated nitrogen gas is sprayed toward the substrates W, vaporization of the silicone is prompted for reducing the drying time. In this stage, the ultrasonic vibration source 61 stops ultrasonic oscillation while the de-ionized water supply nozzles 22 stop supplying the de-ionized water, for discharging the used de-ionized water and silicone from the cleaning bath 20.

Figure 15:
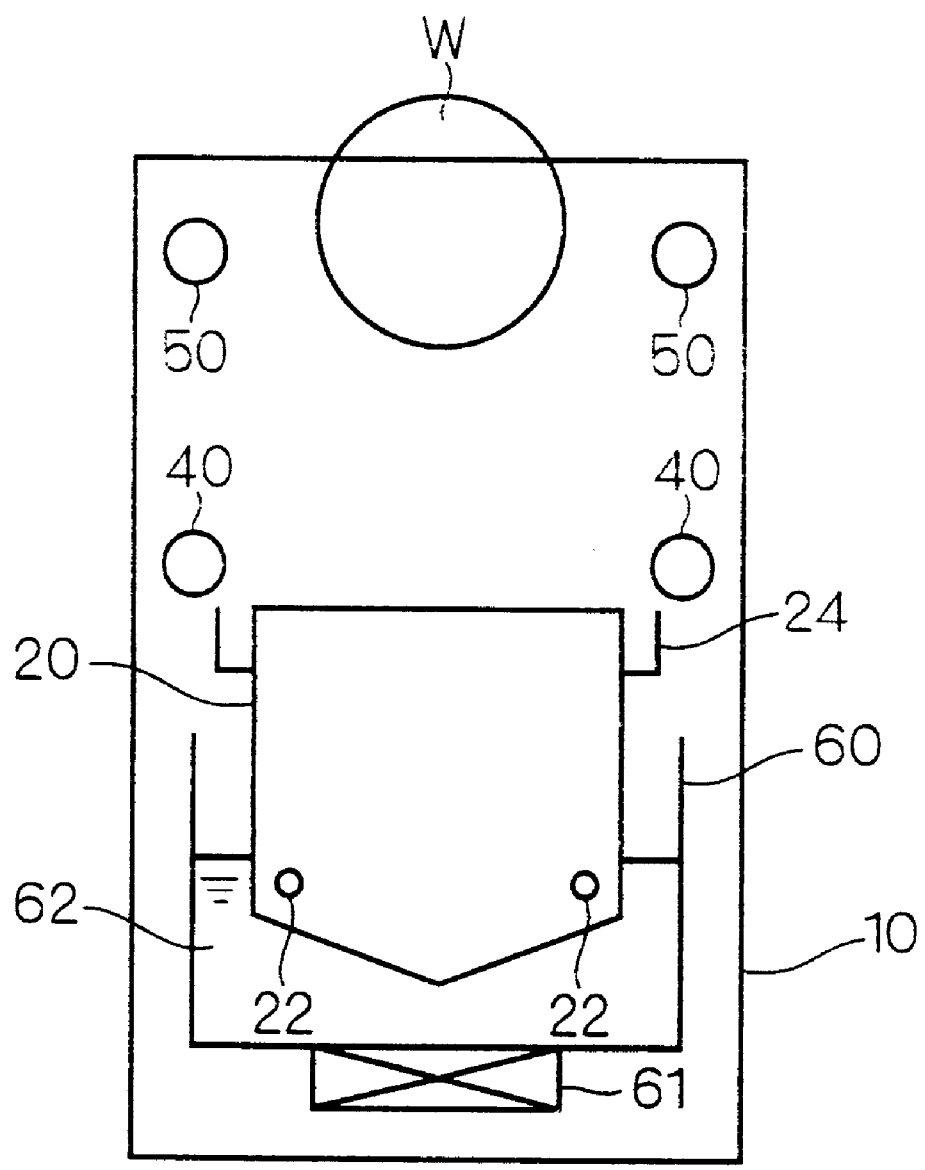

After the silicone adhering to the substrates W completely vaporizes, the nitrogen gas supply nozzles 50 stop supplying the nitrogen gas, and the lid of the drying vessel 10 is opened to discharge the dried substrates W from the apparatus (FIG. 15). The serial drying treatment of the substrates W is terminated in the aforementioned manner.

As hereinabove described, the substrate dryer according to the third embodiment forms the silicone layer on the surface of the de-ionized water stored in the cleaning bath 20 for passing the cleaned substrates W through the silicone layer thereby separating moisture having been in contact with the surfaces of the substrates W and replacing the same with the low-molecular silicone. Then, the low-molecular silicone adhering to the surfaces of the substrates W is vaporized after the replacement, thereby drying the substrates W. The silicone, also employed for cosmetics or the like, is a material applying only light load to the environment and causing no problem such as disruption of the ozone layer or global warming, which requires no specific treatment in disposal. Thus, increase of the cost required for the drying treatment can be suppressed.

In addition, the low-molecular silicone having small surface tension has higher permeability than IPA, as described above. The low-molecular silicone can readily substitute for moisture also in the recent refined·complicated device structure particularly in a portion such as a hole having a large aspect ratio. Therefore, the drying method employing the low-molecular silicone exhibits excellent dryability also in the recent refined·complicated device structure, and hardly causes the problem of a water mark resulting from adhering moisture while preventing the substrates W from adhesion of particles.

Further, the low-molecular silicone having small latent heat of vaporization has a higher drying speed than IPA. Therefore, the drying method employing the low-molecular silicone can reduce the time required for drying as compared with the case of employing IPA, improve the throughput, further suppress formation of a water mark resulting from adhering moisture, and more effectively inhibit the substrates W from adhesion of particles.

According to the third embodiment, the substrates W are passed through the silicone layer formed on the surface of the de-ionized water stored in the cleaning bath 20 for replacing moisture having been in contact with the surfaces thereof with silicone, whereby the moisture in contact with the main surfaces of the substrates W is replaced with the silicone with no exposure to the outside air, and formation of a water mark can be more effectively suppressed.

In the third embodiment, further, the ultrasonic vibration source 61 generates ultrasonic vibration for prompting separation of layers of water having been in contact with the surfaces of the substrates W, thereby further improving the replacement efficiency with the silicone.

In addition, the de-ionized water supply nozzles 22 supply the de-ionized water to the cleaning bath 20 at least while the substrates W pass through the silicone layer for continuously discharging the de-ionized water and the silicone layer from the upper end of the cleaning bath 20 while the drying liquid supply nozzles 40 continuously supply a new drying liquid to the cleaning bath 20 in the third embodiment, whereby moisture separated by replacement and floating in the silicone layer as droplets is successively discharged from the cleaning bath 20 and a new silicone layer is formed on the surface of the de-ionized water stored in the cleaning bath 20, for maintaining the high replacement efficiency with the silicone.

Further, the water-insoluble silicone completely separates from water, to cause no Marangoni convection on the interface between the silicone layer and the de-ionized water. Thus, no problem such as transfer of particles results from a Marangoni convection.

While the third embodiment of the present invention has been described, the present invention is not restricted to the aforementioned example. While the drying liquid vessel 41 stores only the liquid low-molecular silicone for preparing the drying liquid only from the silicone in the third embodiment, for example, the drying liquid vessel 41 may alternatively store a mixed solution of liquid low-molecular silicone and a water-soluble solvent for preparing the drying liquid. The water-soluble solvent can be prepared from alcohol such as IPA, acetone, ketone, carboxylic acid or the like, for example. The content of the water-soluble solvent in the mixed drying liquid must be not more than 10 volume %. If the content of the water-soluble solvent in the mixed drying liquid exceeds 10 volume %, the ratio of the silicone in the mixed drying liquid is so reduced that the aforementioned effect resulting from employment of silicone is hard to attain and a specific problem (a problem of disposal or the like) results from employment of IPA or the like. Such a problem hardly arises when the content of the water-soluble solvent in the mixed drying liquid is not more than 10 volume %.

While the substrate dryer according to the third embodiment is also the so-called batch-system apparatus collectively treating the plurality of substrates W, the technique of the third embodiment is also applicable to the so-called sheet-feed apparatus treating the substrates W one by one.

While the invention has been shown and described in detail, the foregoing description is in all aspects illustrative and not restrictive. It is therefore understood that numerous modifications and variations can be devised without departing from the scope of the invention.

What is claimed is:

1. A substrate dryer for drying a substrate cleaned with de-ionized water, comprising:
    a cleaning bath storing de-ionized water for dipping a substrate in said de-ionized water thereby cleaning said substrate;
    a pull-up robot pulling up cleaned said substrate from said cleaning bath; and
    a drying gas supply part supplying drying gas containing silicone gas to the main surface of said substrate being pulled up by said pull-up robot.

2. The substrate dryer according to claim 1, wherein said drying gas supply part is provided on a side portion of said substrate being pulled up from said cleaning bath by said pull-up robot, and supplies a stream of said drying gas containing said silicone gas toward said substrate.

3. The substrate dryer according to claim 2, wherein said drying gas supply part substantially horizontally forms a stream of said drying gas on the gas-liquid interface of said de-ionized water stored in said cleaning bath.

4. The substrate dryer according to claim 3, wherein said cleaning bath cleans a plurality of substrates stacked at intervals from each other,
    said pull-up robot collectively pulls up said plurality of substrates, and
    said drying gas supply part forms said stream of said drying gas between the respective ones of said plurality of substrates being pulled up by said pull-up robot.

5. The substrate dryer according to claim 4, further comprising:
    a drying gas heating part heating said drying gas to a temperature higher than that of said substrates to be dried by at least 10° C. and feeding the same to said drying gas supply part.

6. The substrate dryer according to claim 5, wherein said silicone gas is a gas phase of low-molecular silicone.

7. The substrate dryer according to claim 6, wherein said drying gas is made of only said silicone gas.

8. The substrate dryer according to claim 6, wherein said drying gas contains said silicone gas and not more than 10 volume % of gas of a water-soluble solvent.

9. A substrate dryer for drying a substrate cleaned with de-ionized water, comprising:
    a cleaning bath storing de-ionized water for dipping a substrate in said de-ionized water thereby cleaning said substrate;
    a pull-up robot pulling up cleaned said substrate from said cleaning bath; and
    a drying gas supply part supplying drying gas containing gas of a fluorine-based inactive liquid to the main surface of said substrate being pulled up by said pull-up robot.

10. The substrate dryer according to claim 9, wherein said drying gas supply part is provided on a side portion of said substrate being pulled up from said cleaning bath by said pull-up robot, and supplies a stream of said drying gas containing said gas of said fluorine-based inactive liquid toward said substrate.

11. The substrate dryer according to claim 10, wherein said drying gas supply part substantially horizontally forms said stream of said drying gas on the gas-liquid interface of said de-ionized water stored in said cleaning bath.

12. The substrate dryer according to claim 11, wherein said cleaning bath cleans a plurality of substrates stacked at intervals from each other,
    said pull-up robot collectively pulls up said plurality of substrates, and
    said drying gas supply part forms said stream of said drying gas between the respective ones of said plurality of substrates being pulled up by said pull-up robot.

13. The substrate dryer according to claim 12, further comprising:
    a drying gas heating part heating said drying gas to a temperature higher than that of said substrates to be dried by at least 10° C. and feeding the same to said drying gas supply part.

14. The substrate dryer according to claim 13, wherein said fluorine-based inactive liquid is expressed in the following general formula:

$$(C_{(n)}F_{(2n+1)}\text{---}O\text{---}R_1)$$

where $R_1$ represents an alkyl group and n represents a natural number.

15. The substrate dryer according to claim 14, wherein said drying gas is made of only said gas of said fluorine-based inactive liquid.

16. The substrate dryer according to claim 14, wherein said drying gas contains said gas of said fluorine-based inactive liquid and not more than 10 volume % of gas of a water-soluble solvent.

17. The substrate dryer according to claim 14, wherein said fluorine-based inactive liquid is ethyl perfluorobutyl ether.

18. A substrate dryer for drying a substrate cleaned with de-ionized water, comprising:
    a cleaning bath storing de-ionized water for dipping a substrate in said de-ionized water thereby cleaning said substrate;

a pull-up robot pulling up cleaned said substrate from said cleaning bath; and a silicone layer forming part supplying a drying liquid containing silicone to the surface of said de-ionized water stored in said cleaning bath for forming a silicone layer, wherein said pull-up robot pulls up cleaned said substrate from said cleaning bath thereby passing said substrate through said silicone layer formed on the surface of said de-ionized water stored in said cleaning bath.

19. The substrate dryer according to claim 18, further comprising:

an ultrasonic vibration supply part supplying ultrasonic vibration to said de-ionized water stored in said cleaning bath and said silicone layer formed on the surface of said de-ionized water.

20. The substrate dryer according to claim 19, further comprising:

a de-ionized water supply part supplying said de-ionized water to said cleaning bath, wherein said de-ionized water supply part supplies said de-ionized water to said cleaning bath thereby continuously discharging said de-ionized water and said silicone from an upper end of said cleaning bath and said silicone layer forming part continuously supplies said drying liquid to said cleaning bath while said pull-up robot passes said substrate through said silicone layer.

21. The substrate dryer according to claim 20, wherein said silicone is low-molecular silicone.

22. The substrate dryer according to claim 21, wherein said drying liquid is made of only said silicone.

23. The substrate dryer according to claim 21, wherein said drying liquid contains said silicone and not more than 10 volume % of a water-soluble solvent.

* * * * *